US006079096A

United States Patent [19]

Hata et al.

[11] Patent Number: 6,079,096

[45] Date of Patent: Jun. 27, 2000

[54] COMPONENT MOUNTING APPARATUS

[75] Inventors: Kanji Hata, Katano; Noriaki Yoshida, Ikeda; Tomonori Sano, Kofu, all of Japan

[73] Assignee: Matsushita Electric Industrial Co., Ltd., Osaka, Japan

[21] Appl. No.: 09/043,469

[22] PCT Filed: Oct. 31, 1996

[86] PCT No.: PCT/JP96/03196

§ 371 Date: Mar. 20, 1998

§ 102(e) Date: Mar. 20, 1998

[87] PCT Pub. No.: WO97/17826

PCT Pub. Date: May 15, 1997

[30] Foreign Application Priority Data

Nov. 6, 1995 [JP] Japan .................................... 7-286968

[51] Int. Cl.[7] ...................................................... B23P 19/00

[52] U.S. Cl. ................................ 29/740; 29/743; 29/832; 29/759; 198/475.1; 198/476.1

[58] Field of Search .............................. 29/740, 741, 743, 29/832, 729, 759, 712, 33 P; 198/475.1, 476.1, 346.1, 346.2, 345.2, 345.3, 465.1

[56] References Cited

U.S. PATENT DOCUMENTS 4,915,565 4/1990 Bond et al. ............................. 414/225
5,044,069 9/1991 Asai et al. ................................. 29/740
5,234,304 8/1993 Okumoto et al. ....................... 414/225
5,329,692 7/1994 Kashiwagi .
5,628,107 5/1997 Nushiyama et al. ...................... 29/740
5,636,435 6/1997 Okumoto et al. ......................... 29/740
5,740,604 4/1998 Kitamura et al. ......................... 29/832
5,933,942 8/1999 Kitamura et al. ......................... 29/740

FOREIGN PATENT DOCUMENTS 0 391 707 10/1990 European Pat. Off. .

*Primary Examiner*—Carl J. Arbes
*Assistant Examiner*—Minh Tzinh
*Attorney, Agent, or Firm*—Wenderoth, Lind & Ponack, L.L.P.

[57] ABSTRACT

A component feeding device located on a rear side of an apparatus body includes a component feed table circulation path within a vertical plane, and a plurality of movers as well as table lifting mechanisms for moving independently a plurality of component feed tables placed within the circulation path. By this arrangement, the component feeding device does not need to be upsized even if the number of components is increased. Also by this arrangement a speedup of component feeding is achieved. By providing a component exchanging device for pulling out a component feed table from a takeout position of the circulation path and transferring it up to an exchange position on a front side of the apparatus body, it is possible to carry out the exchange of the component feed tables on the front side of the apparatus body.

14 Claims, 9 Drawing Sheets

COMPONENT MOUNTING APPARATUS

TECHNICAL FIELD

The present invention relates to a component mounting apparatus for mounting various types of components such as electronic components onto circuit boards or the like and, more particularly, to a component mounting apparatus in which a component feed table can be pulled out to a specified exchange position set on the apparatus front side of the apparatus body, so as to be easily exchanged for another component feed table.

BACKGROUND ART

Generally, in the electronic component mounting apparatus, with a large number of component feed means set in parallel on a component feed table, the component feed means are set to a specified component feed position one by one according to the order of components to be mounted in mounting the components, while the component feed tables are moved in the directions in which the component feed means are arrayed in parallel. Then, the components of the component feed means are sucked up and taken out by a mounting head section, and further transferred and mounted onto a circuit board positioned to a circuit board positioning section.

A conventional component mounting apparatus of this type is described with reference to FIG. 8, which shows a perspective view of the apparatus, and FIG. 9, which shows a schematic plan view thereof. Referring to FIG. 8, at the front of an apparatus body 1 is disposed a board positioning means 4 for positioning to a mounting position a circuit board P which is fed from a board feed means 2. The circuit board P, on which required components have been mounted at the board positioning section 4, will be discharged by a board discharge means 3. On the other hand, at the rear of the apparatus body 1 is disposed a component feed means 7. Between the component feed section 7 and the board positioning section 4, as shown in FIG. 9, is disposed a mounting head section 8 of the rotary type.

In the component feed section 7, two component feed tables 10, 11 are provided so as to be movable rightward and leftward on a guide rail 9 independently of each other. On the component feed tables 10, 11, a multiplicity of component feed units 12 as component feed means are set in parallel along a direction in which the component feed tables 10, 11 move. The component feed units 12 are exemplified in the figure by one which is generally so called parts cassettes, and described in brief below. That is, electronic components of a kind are accommodated on a carrier tape with equal intervals and wound around a reel 13 in a state that the components are covered with a cover tape. The carrier tape is unreeled from the reel 13 and fed at a pitch equal to the interval at which the components are accommodated. Further, the cover tape is wound up, by which the front-end electronic component is positioned to a component feed position A facing one of component suck-up heads 14 of the mounting head section 8.

As shown in FIG. 9, the mounting head section 8 comprises a plurality of component suck-up heads 14 provided at equal angular intervals on the same circumference of a turntable (not shown) provided rotatable about a vertical axis. Each of the component suck-up heads 14 is designed to suck up a component with evacuation means. With the turntable intermittently rotated, each of the component suck-up heads 14 is stopped at the component feed position A and a component placement position B in turn, where the reception of components from the component feed units 12 and the placement of components onto the circuit board P are carried out concurrently. Also, while one component feed table 10 is feeding a component, the other component feed table 11 retreated in the standby position performs the exchange of the component feed units 12 and the replenishment of components, thus making preparations so that the component mounting apparatus is enabled to operate without rest.

However, in the above component mounting apparatus, a board transfer mechanism section comprising the board feed means 2, the board positioning means 4, and the board discharge means 3 is placed on the front side of the apparatus body 1, and the component feed section 7 is disposed rearward of the board transfer mechanism section. As a result, the component mounting apparatus has a defect that it cannot easily accomplish the exchange of the component feed units 12. In more detail, this type of component mounting apparatus would necessarily be installed in such a way that the rear-side component feed section 7, which hardly needs to be accessed except for the component exchange process, is placed as close to the wall surface as possible because of the need of enhancing the use efficiency of the floor space. Accordingly, the work of exchanging the component feed units 12 would necessarily be done in a poor-workability posture in a small space, often taking much labor. Furthermore, since the exchange of component feed units is done with component feed tables located in the component feed path, there is a need of taking care of safety for workers.

Meanwhile, in recent years, there has been a tendency that the number of kinds of circuit boards to be produced as well as the number of kinds of components to be mounted onto the boards are on the increase. On the other hand, when components set on both of the two component feed tables 10, 11 are fed to circuit boards P of the same kind, it would be impossible to change the arrangement for the next model during the mounting process, which would result in a lowered availability factor of the system. This may lead to an idea of increasing the number of component feed units 12 to be set on the component feed tables 10, 11. In such a case, however, the length of the whole component feed section 7 would become significantly longer, not only resulting in a deterioration of the use efficiency of the space, which in turn would cause the productivity per floor area to lower, but also causing the weights of the feed tables 10, 11 to increase, which in turn would necessitate larger driving force for their movements. Moreover, vibrations due to the movement and stop of the feed tables 10, 11 would increase, such that any the operating speed could not be enhanced. Still further, an increased length of the whole component feed section 7 would make it more difficult to exchange the component feed units 12.

DISCLOSURE OF INVENTION

Accordingly, an object of the present invention is to provide a component mounting apparatus which can prevent the component feeding device from being upsized sideways even if the components to be mounted onto the board have increased in number, and which can achieve an enhancement of the component feeding speed, and yet which allows the exchange of component feed tables to be performed at a particular point on the front side of the apparatus body.

In accomplishing these and other aspects, according to a first aspect of the present invention, there is provided a component mounting apparatus comprising:

a mounting head section for mounting components onto a board; and a component feeding device, disposed on a rear side of the apparatus body, for feeding each of a plurality of component feed tables on each of which the components are accommodated, to a component feed position opposed to the mounting head section, the component feeding device comprising:

a component-feed-table circulation path within a vertical plane; and apparatus for moving the plural component feed tables arranged within the circulation path along the circulation path, the component mounting apparatus further comprising:

a table exchange path which extends from a takeout position in the circulation path to an exchange position on the front side of the apparatus body; and a component exchanging device for transferring the component feed table along the table exchange path between the takeout position and the exchange position, selectively in one of a direction in which the component feed table is directed from the takeout position to the exchange position and a direction in which the component feed table is directed from the exchange position to the takeout position.

With this arrangement, even if the number of components to be mounted onto the board has increased, the required number of components can be divided and accommodated to the plurality of component feed tables, so that one component feed table can be downsized. Also, the component feed tables are transferred along the table circulation path within the vertical plane, so that the installation space of the apparatus will not increase. Furthermore, a higher speed of the component feeding process can be achieved based on the arrangements that the driving force for the component feed tables can be reduced and that the exchange and transfer of the component feed tables can be carried out independently of and simultaneously with the component feeding operation to the mounting head section.

Yet further, since the component feed tables can be transferred to and exchanged at a place on the front side of the apparatus body, the exchanging work of the component feed tables can be carried out extremely easily and promptly. Moreover, since the component feed tables are departed from the circulation path of the component mounting apparatus, the safety of the worker can be ensured. Still more, there is an advantage that the control of all the items including the state how the components have been mounted onto the circuit board can be carried out quite easily on the front side of the apparatus body.

According to a second aspect of the present invention, there is provided the component mounting apparatus according to the first aspect, wherein the component exchanging device comprises:

a rear-side table lifting mechanism, disposed on the rear side of the apparatus body, for lifting and lowering the component feed table between an upper rear-side transfer position adjacent to the takeout position located in an upper part of the circulation path of the component feeding device and a lower rear-side transfer position below the upper rear-side transfer position; and a table transfer apparatus for transferring the component feed table horizontally between the lower rear-side transfer point and a front-side transfer point located at the front side of the apparatus body, below a board transfer apparatus of the component mounting apparatus body.

According to a third aspect of the present invention, there is provided the component mounting apparatus according to the second aspect, wherein the component exchanging device further comprises:

a front-side table lifting mechanism, disposed on the front side of the apparatus body, for lifting and lowering the component feed table between the front-side transfer point and an exchange position located above the front-side transfer point.

According to a fourth aspect of the present invention, there is provided the component mounting apparatus according to the first aspect, wherein the component exchanging device comprises:

a component-feed-table shifting apparatus for shifting the component feed table to and from the takeout position located in a lower part of the circulation path of the component feeding device; and a table transfer apparatus for transferring the component feed table horizontally between the component-table shifting apparatus and a front-side transfer point located at the front side of the apparatus body, below a board transfer apparatus of the component mounting apparatus body.

According to a fifth aspect of the present invention, there is provided the component mounting apparatus according to the fourth aspect, wherein the component exchanging device comprises:

a front-side table lifting mechanism, disposed on the front side of the apparatus body, for lifting and lowering the component feed table between the front-side transfer point and an exchange position located above the front-side transfer point.

With this arrangement, the component feed tables can be taken out to the front side of the apparatus body without causing any obstacles to the board transfer apparatus such as a board feed device or a board discharge device. Moreover, the component feeding device is enabled to transfer the component feed tables along the circulation path independently of the component exchanging work by the component exchanging device.

According to a sixth aspect of the present invention, there is provided the component mounting apparatus according to the third or fifth aspect, wherein a turntable which rotates the component feed table placed thereon is provided on a lifting base in the front-side table lifting mechanism.

With this arrangement, the component feed tables can be taken out so as to be reversed in their back-and-forth direction so that the exchange of the component feed tables themselves or the component feed units accommodated on the component feed tables can be accomplished more easily.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
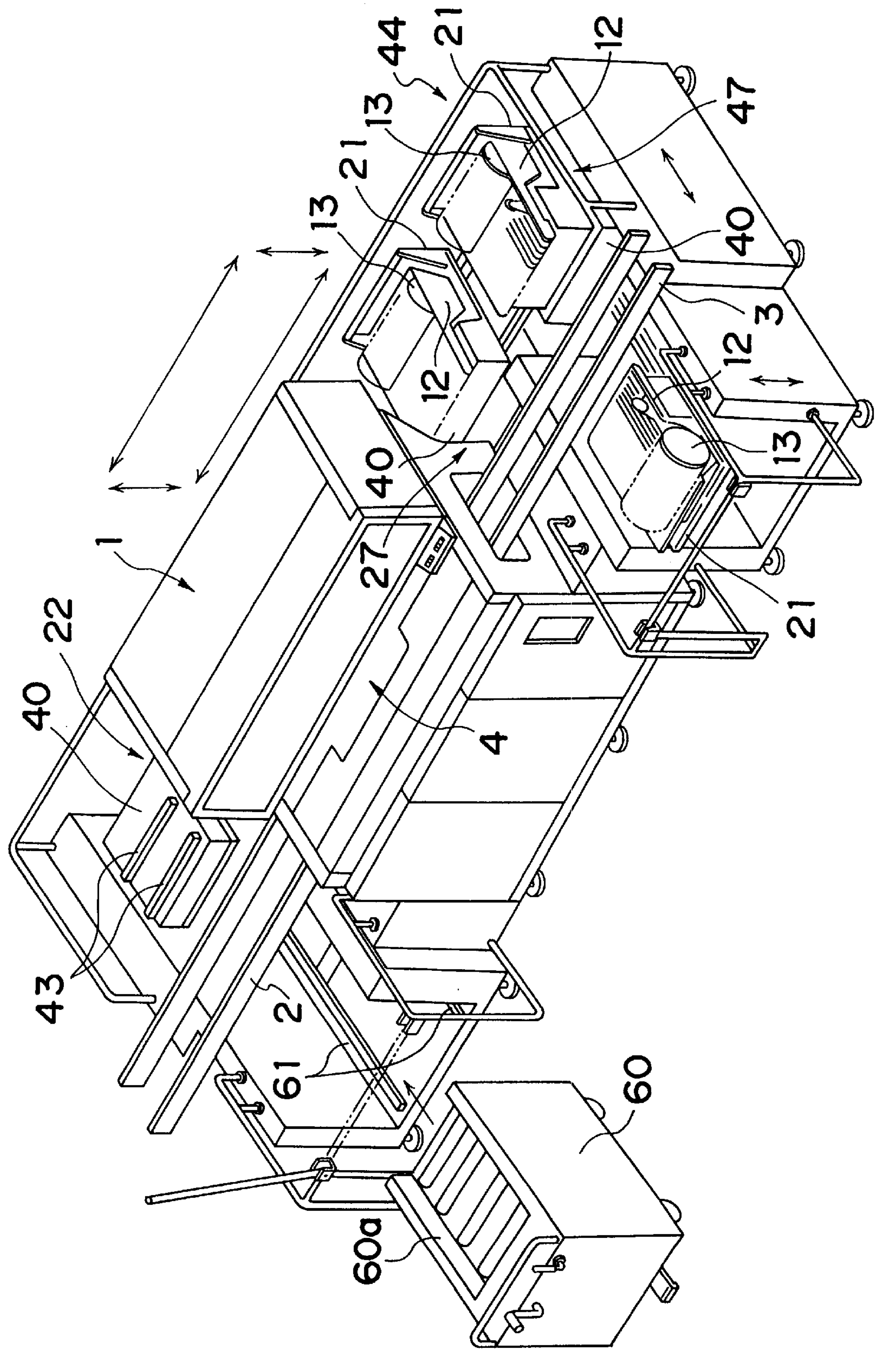
FIG. 1 is a perspective view showing a component mounting apparatus according to an embodiment of the present invention.

Before the description of the present invention proceeds, it is to be noted that like parts are designated by like reference numerals throughout the accompanying drawings.

Hereinbelow, embodiments of the present invention are described with reference to FIGS. 1 to 7.

Figure 2:
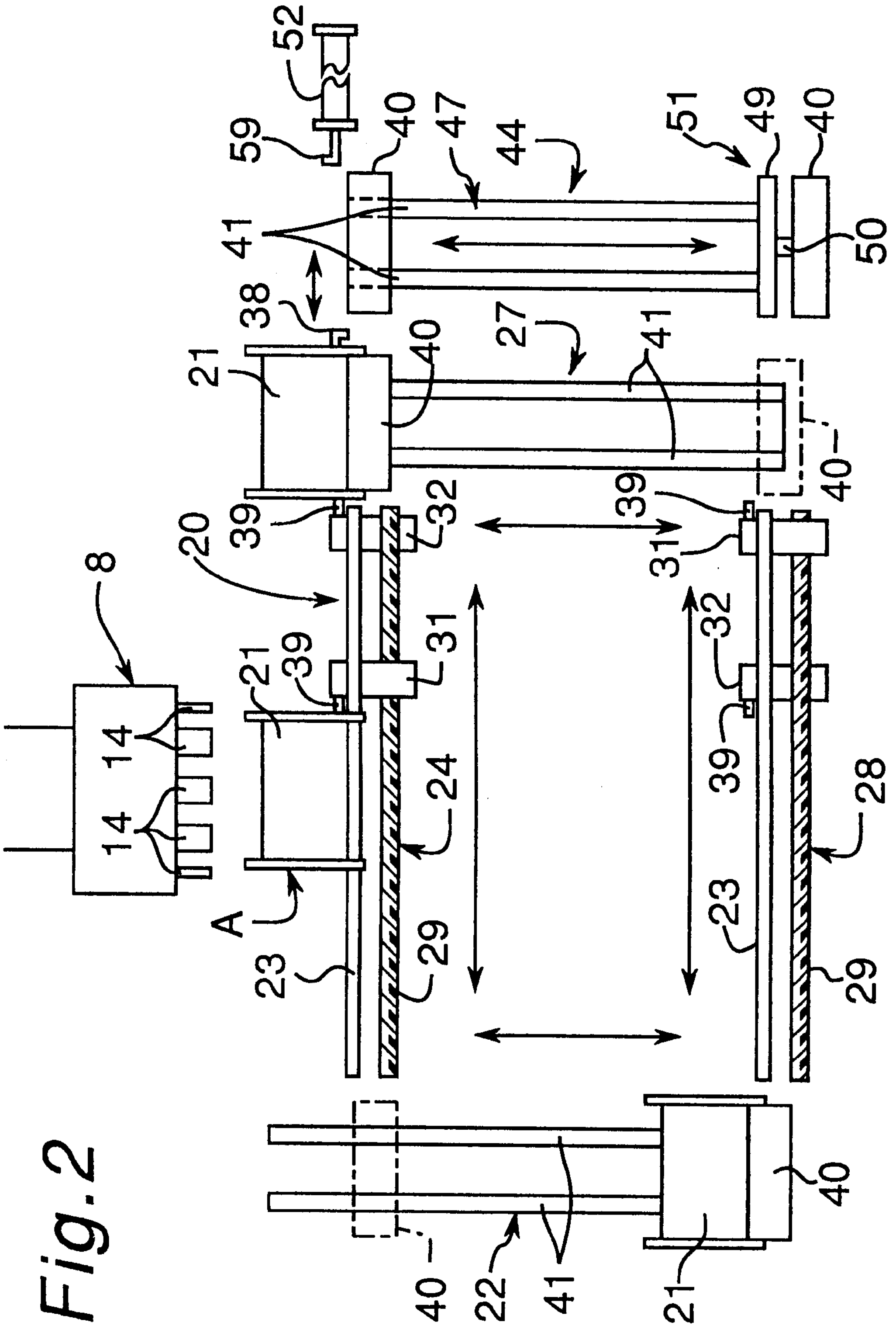
FIG. 2 is a schematic front view of the apparatus.
Figure 3:
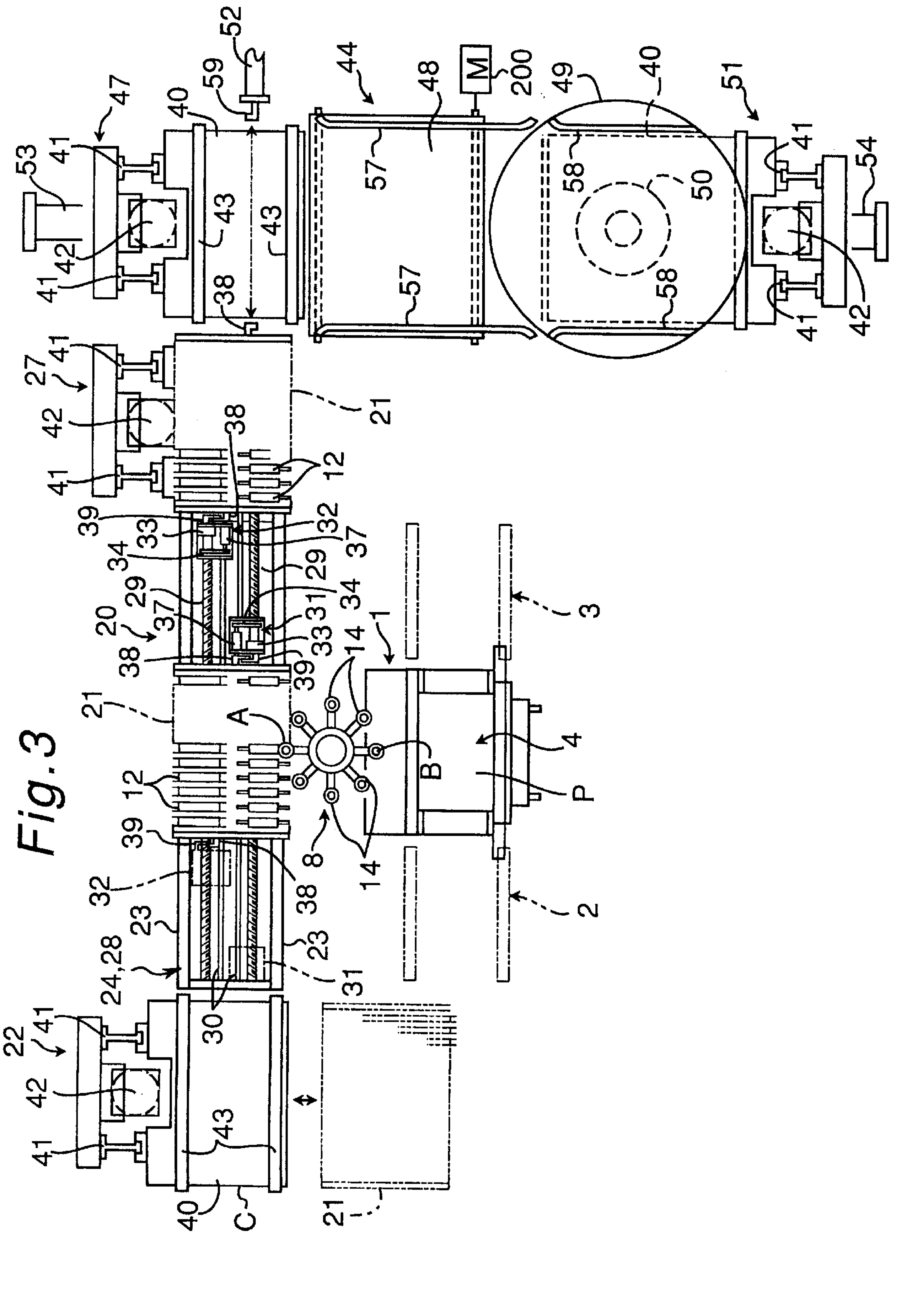
FIG. 3 is a schematic plan view of the apparatus.

FIG. 1 is a perspective view of a component mounting apparatus according to an embodiment of the present invention, as viewed from the front side. FIG. 2 is a front view outlining the arrangement of the apparatus. FIG. 3 is a plan view outlining the arrangement of the component mounting apparatus.

Figure 8:
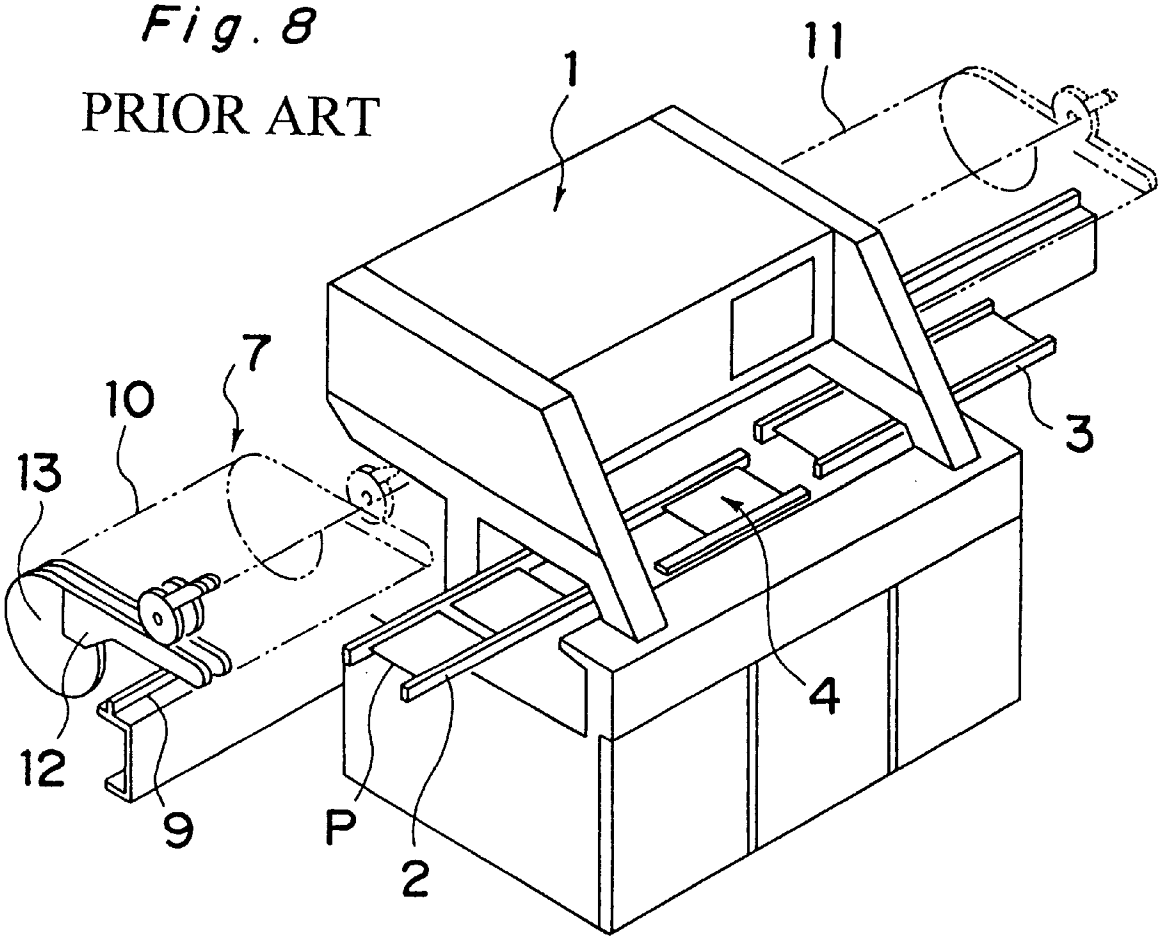
FIG. 8 is a perspective view of a conventional component mounting apparatus.
Figure 9:
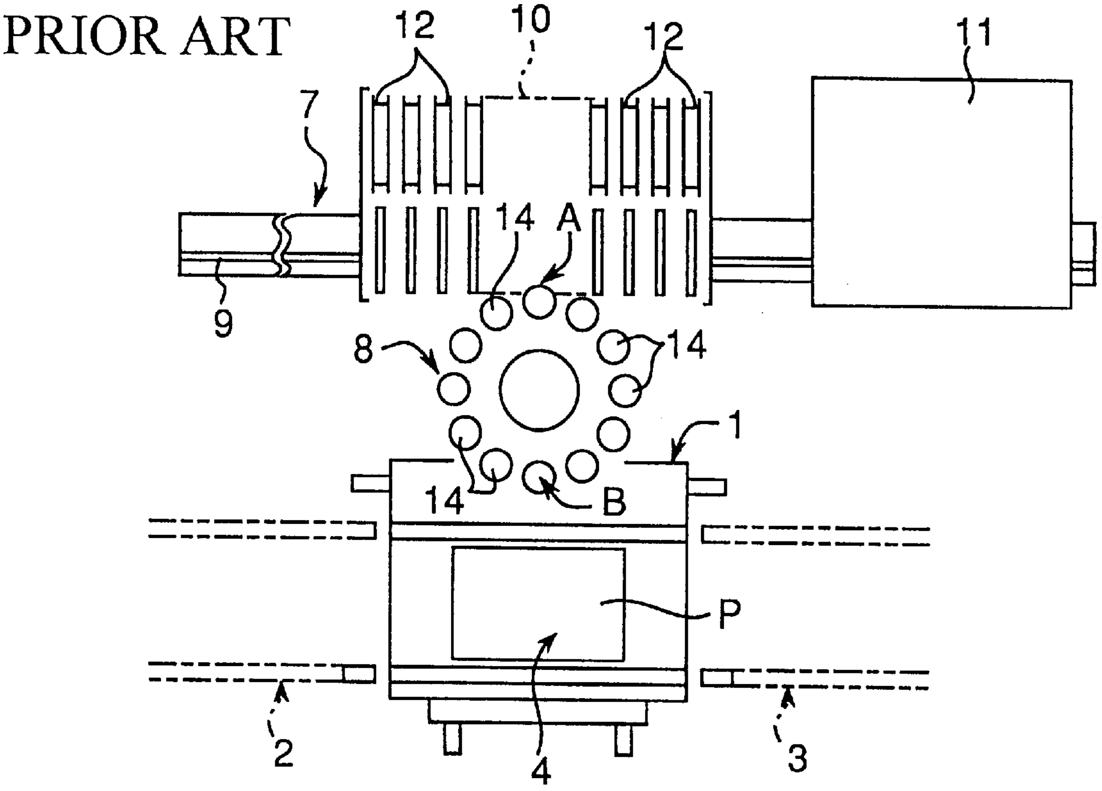
FIG. 9 is a schematic plan view of the apparatus.

In these figures, the same or equivalent components as those in FIGS. 8 and 9 are designated by the same reference numerals, and their description is omitted. This means that the mechanism for sucking up and mounting the components to circuit boards P is the same as that of the conventional apparatus and is so omitted in description. Below described are the mechanism for feeding the components and the mechanism for exchanging the components, both of which are the feature of the present invention.

A component feeding device 20, as shown in FIG. 2, has a circulation path along which component feed tables 21 are transferred in a loop within a vertical plane. In more detail, arranged a rectangular form in within the vertical plane, are right and left table lifting mechanisms 22, 27 for lifting and lowering component feed tables 21; a table feed mechanism 24 for transferring the component feed tables 21 lifted by the table lifting mechanisms 22, 27 horizontally (rightward and leftward in the figure) along upper guide rails 23 and thereby feeding them to a component feed position A located below a mounting head section 8; and a table transfer mechanism 28 for transferring the component feed tables 21 lowered to lower-limit positions by the table lifting mechanisms 22, 27, between the two table lifting mechanisms 22, 27 along lower guide rails 23.

The table feed mechanism 24 and the table transfer mechanism 28 are of such a generally similar construction as shown in FIG. 3. More specifically, each of the two mechanisms 24, 28 comprises a pair of the guide rails 23 which are arranged parallel within the same horizontal plane and which serve for guiding the component feed tables 21; a pair of ball screws 29 arranged parallel within the same horizontal plane at lower places between the two guide rails 23; and movers 31, 32 which are to be mated with the ball screws 29, respectively, and which move along guide shafts 30. The two movers 31, 32 are of the same construction in which they are each internally equipped with a nut 33 to be mated with the ball screw 29, and a drive motor 37 for driving the nut 33 into rotation via interlocking means 34 such as a belt, except that L-shaped coupling portions 39 to be disengageably engaged with L-shaped to-be-coupled portions 38, respectively, protruded from both end portions of the component feed tables 21 in their moving direction are provided so as to be directed in opposite directions with respect to the moving direction. These coupling portions 39 are actuated so as to be coupled with or decoupled from the to-be-coupled portions 38 by an unshown drive means 39*a*. By this actuation, the movers 31, 32 are coupled with or decoupled from the component feed tables 21.

Figure 4:
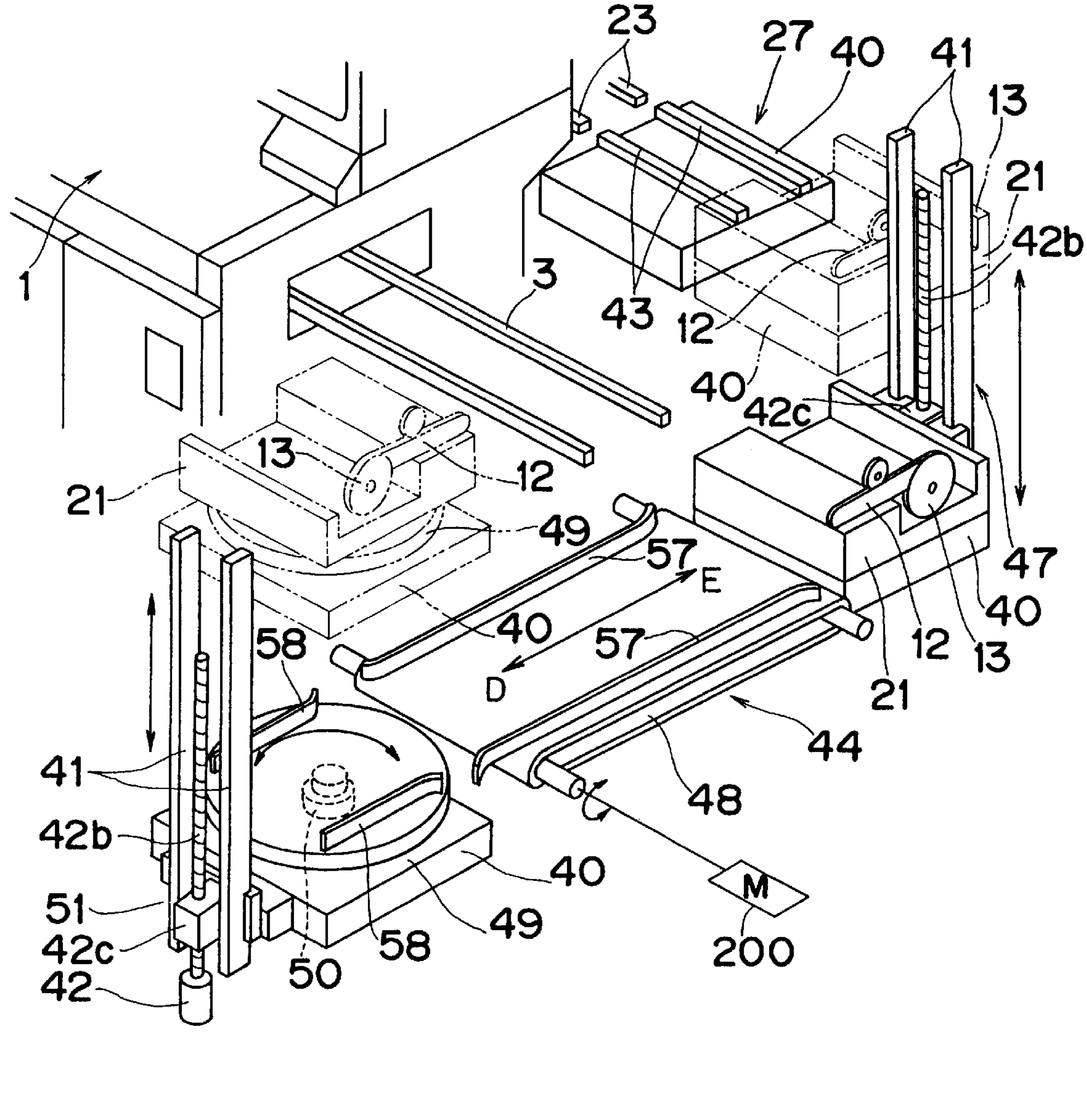
FIG. 4 is a schematic perspective view of a component exchanging device in the apparatus.

The right and left table lifting mechanisms 22, 27 are of the generally same construction, as shown in FIGS. 2 and 3. In more detail, each of the two mechanisms 22, 27 comprises: a lifting base 40 on which a component feed table 21 can be placed; a pair of lifting guides 41 for supporting the lifting base 40 up-and-down movably; and a lifting drive source 42 implemented by a drive motor or cylinder that lifts and lowers the lifting base 40 along the lifting guides 41. The actuating member, such as a ball screw or chain, to be actuated by the lifting drive source 42 is omitted in the figures. But FIG. 4 shows a case where a motor 42 serving as the lifting drive source 42, a ball screw 42*b* rotated by the motor 42, and a nut 42*c* engaged with the ball screw 42*b* are used as an example of the actuating member. That is, the ball screw 42*b* is reversibly rotated by the motor 42 and then the nut 42*c* engaged with the ball screw 42*b* is vertically moved upward or downward to move the lifting base 40 connected to the nut 42*c* while guided by the lifting guides 41. On the top surface of the lifting base 40, are provided guide rails 43 for shifting the component feed table 21 to and from the guide rails 23.

Next described is a component exchanging device 44. This component exchanging device 44 in this embodiment is juxtaposed on the right side of the component feeding device 20 as shown in FIGS. 2 and 3. FIG. 4 shows a perspective view of the component exchanging device 44. As apparent from this figure, the component exchanging device 44 essentially comprises: a table lifting mechanism 47 of the same construction as the foregoing table lifting mechanisms 22, 27; a belt conveyor 48 for transferring a component feed table 21 lowered by the table lifting mechanism 47, to the front side of the apparatus body 1 by its drive motor 200; a turntable 49 for turning the component feed table 21 transferred by the belt conveyor 48 by 180° on a horizontal plane so that the component feed table 21 is reversed in position in the back-and-forth direction; and a table lifting mechanism 51 which has the same construction as the table lifting mechanism 47 and which has the turntable 49 and a rotation drive source 50 for the turntable 49, such as a motor, placed on the top surface of its lifting base 40.

The component exchanging device 44, as shown in FIGS. 2 and 3, further comprises: an air cylinder 52 for delivering the component feed table 21 to and from the adjacent table lifting mechanism 27 between their respective lifting bases 40 both lifted up to the upper-limit positions; an air cylinder 53 (schematically shown in FIG. 3) for delivering the component feed table 21 between the lifting base 40 lowered to the lower-limit position in the table lifting mechanism 47 and the belt conveyor 48; and an air cylinder 54 (schematically shown in FIG. 3) for delivering the component feed table 21 between the belt conveyor 48 and the turntable 49 placed on the lifting base 40 lowered to the lower-limit position in the table lifting mechanism 51. At an end of a piston rod of the air cylinder 52, is formed a coupling portion 59 which is disengageably engaged with the to-be-coupled portion 38 of the component feed table 21 by a engaging/disengaging device 52*a*. At an end of a piston rod of each air cylinder 53 and 54, is formed a coupling portion 59 which is disengageably engaged by each engaging/disengaging device 53*a*, 54*a* with one of to-be-coupled portions formed on front and rear surfaces of the component feed table 21 each of which is similar to the to-be-coupled portion 38.

In upper part of the belt conveyor 48, are disposed a pair of restrictive guides 57 which are arranged parallel at a spacing corresponding to the shorter-side length of the component feed table 21 and which serve for restricting the moving direction of the component feed table 21. Also, on the turntable 49, are fixed a pair of positioning guides 58 in correspondence to the restrictive guides 57.

Figure 5:
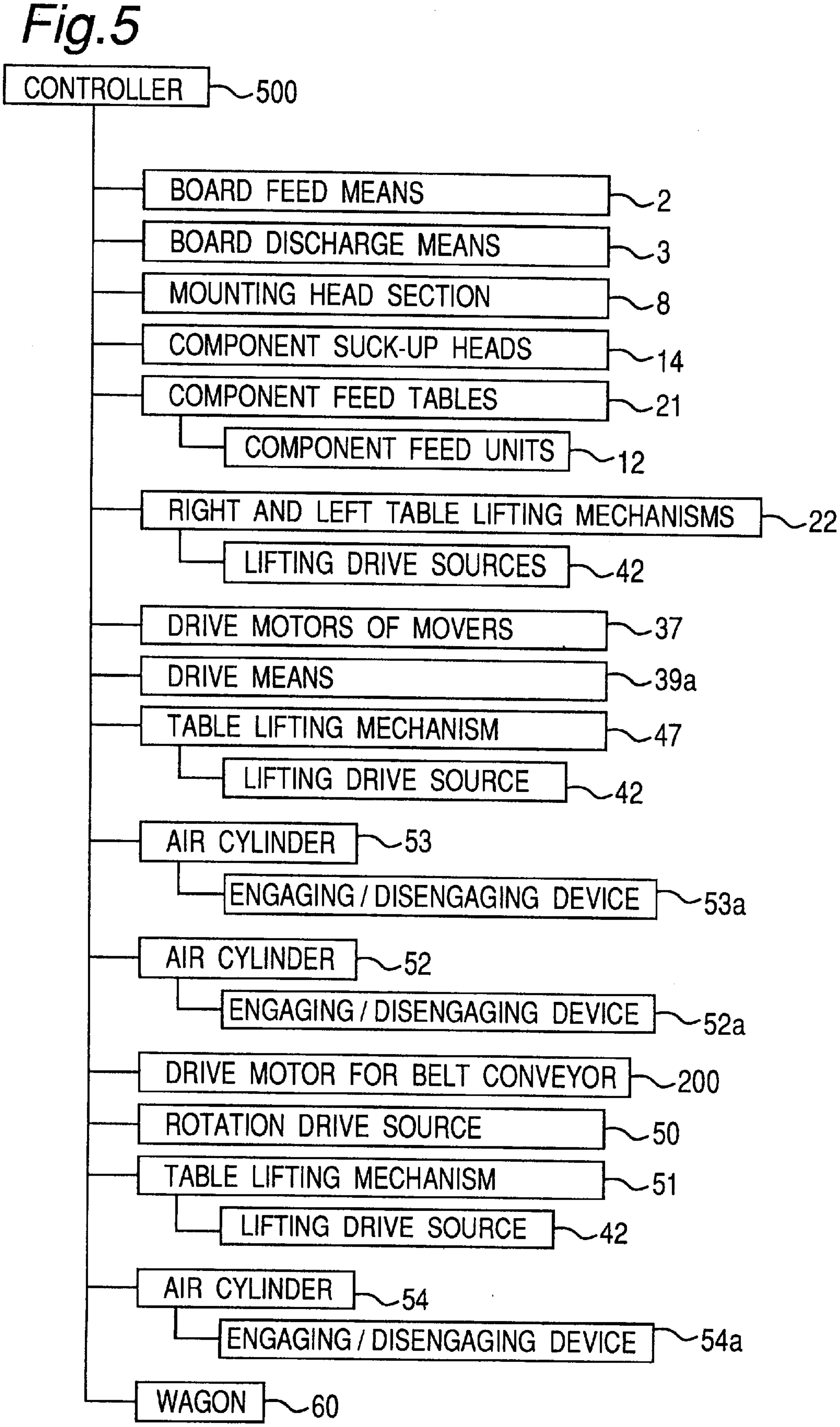
FIG. 5 is a block diagram showing construction for carrying out control operations of the apparatus.

Next, the operations of the component feeding device 20 and the component exchanging device 44 are explained. The operations described below are controlled by a controller 500 which is connected to the various driving means or members described above as shown in FIG. 5. In FIG. 5, the coupling/decoupling devices allow the coupling and decoupling between the coupling portions 39 and the to-be-coupled portions 38. Although the component feeding device 20, as shown in FIG. 2, is enabled to circulate the component feed table 21 either clockwise or counterclockwise, as viewed from the front, along the looped circulation path, the following description is made for a case in which the component feed table 21 is transferred clockwise. Referring to FIG. 2, the component feed table 21 placed on the lifting base 40 lowered to the lower-limit position in the left-side table lifting mechanism 22 is held at such a height position that the component feed table 21 can be shifted onto the guide rails 23 of the table feed mechanism 24, when the lifting base 40 is lifted by the drive of the lifting drive source 42 up to the upper-limit position as shown by a two-dot chain line in FIG. 2.

The two movers 31, 32 of the table feed mechanism 24 are movable rightward and leftward independently of each other while they are passed by each other along the ball screws 29 and the guide shafts 30. When the component feed table 21 is held at such a height position that the component feed table 21 can be shifted onto the guide rails 23 of the table feed mechanism 24 by the table lifting mechanism 22 as described above, the mover 31, which serves for pulling out the table 21 in the case of clockwise circulation of the component feed table 21, is moved up to the leftmost position shown by a two-dot chain line in FIG. 3 by the drive of the drive motor 37, so that its coupling portion 39 is opposed to the right-side to-be-coupled portion 38 of the component feed table 21. Subsequently, the mover 31 is actuated so as to have the coupling portion 39 mated with the to-be-coupled portion 38 of the component feed table 21, and thereby coupled with the component feed table 21.

Next, by the drive motor 37 being driven to rotate in the direction reverse to the above, the mover 31 is moved rightward of FIGS. 2 and 3, by which the component feed table 21 is moved along the guide rails 43 so as to be pulled out from the lifting base 40 onto the upper guide rails 23, and then transferred toward the component feed position A. The components of the component feed units 12 set on this component feed table 21 are sucked up and taken out one by one by the mounting head section 8 under the rightward movement of the component feed table 21 at the component feed position A. When the pull-out mover 31 is moved up to the rightmost position on the further right side of a position shown by solid lines in FIG. 3, the takeout of the components is completed.

Upon completion of the takeout of the components, the pull-out mover 31 makes the coupling portion 39 demated from the to-be-coupled portion 38 and then moves up to the leftmost position in FIG. 3, preparing for the pull-out of the next component feed table 21. Concurrently with this, the mover 32, which serves for pushing out the table 21 in the case of clockwise circulation of the component feed table 21, makes the coupling portion 39 mated with the to-be-coupled portion 38 as shown by a two-dot chain line in FIG. 3 and thereby coupled with the component feed table 21, and then takes over the component feed table 21 from the pull-out mover 31, pushing and moving it. In addition, although the table push-out mover 32 actually will not move up to the two-dot chain line position of FIG. 3, it is shown imaginarily for the purpose of showing the mated state.

The component feed table 21 over the feeding of the components is pushed out from the guide rails 23 onto the guide rails 43 as shown in FIGS. 2 and 3, by the push-out mover 32 moving up to the rightmost position, and thereby shifted onto the lifting base 40 of the right-side table lifting mechanism 27. The lifting base 40 located at the upper-limit position in the table lifting mechanism 27 is the place where the component feed table 21 is departed from the circulation path. The component feed table 21 transferred to this takeout position is sent to below in the circulation path, standing by until it is used again. In addition, when the component feed table 21 needs an exchange of the component feed units 12, the component feed table 21 is sent to the component exchanging device 44, where it is exchanged for a new component feed table 21. The operation of the component exchanging device 44 will be described later.

When the component feed table 21, or a new component feed table 21 sent from the component exchanging device 44, is placed on the lifting base 40 located at the upper-limit position of the right-side table lifting mechanism 27, the table lifting mechanism 27 operates so that the lifting base 40 is lowered to the lower-limit position shown by the two-dot chain line in FIG. 2. At this point, the component feed table 21 on the lifting base 40 is positioned and held at such a height that the component feed table 21 can be shifted onto the lower guide rails 23 of the table transfer mechanism 28. In the table transfer mechanism 28, although its construction is similar to that of the table feed mechanism 24, the movers 31, 32 are reversed between the pull-out and push-out use with respect to the table feed mechanism 24. Accordingly, by the same operation as that of the table feed mechanism 24 described above, the pull-out mover 31 pulls out the component feed table 21 from on the lifting base 40 onto the lower guide rails 23, and then moves it to an intermediate position of the table transfer mechanism 28, where the component feed table 21 is taken over by the push-out mover 32, pushed and moved leftward, so as to be shifted onto the lifting base 40 of the left-side table lifting mechanism 22. From this on, by the same operation as described above, the component feed table 21 is transferred along the looped circulation path.

In addition, when the component feed table 21 is changed so as to be circulated counterclockwise along the looped circulation path, the movers 31, 32 are moved in the opposite direction to the above, where it is enough to change the pull-out mover to the push-out mover and to change the push-out mover to the pull-out mover. By selectively changing the direction of circulation of the component feed table 21 in the circulation path as required, it becomes possible to select any of the component feed tables 21 present in the circulation path, move it to the takeout position in the circulation path, and send it to the component exchanging device 44, where it can be exchanged for another.

Next, the operation of the component exchanging device 44, which forms the feature of the present invention, is explained. The component feed table 21, which needs an exchange of the component feed units 12, is shifted from the guide rails 23 of the table feed mechanism 24 to the lifting base 40 of the right-side table lifting mechanism 27 by the push-out mover 32, the piston rod of the air cylinder 52 is leftward protruded as shown by an arrow indicated by a two-dot chain line in FIG. 3 so that the coupling portion 59 at its end is mated with the to-be-coupled portion 38 of the component feed table 21. Thereafter, the air cylinder 52 is actuated so as to pull back the piston rod, so that the component feed table 21 is guided by the guide rails 43 so as to be pulled out onto the lifting base 40 of the table lifting mechanism 47. That is, the component feed table 21 is departed from the circulation path so as to be taken out to the component exchanging device 44.

Subsequently, the coupling portion 59 of the air cylinder 52 is demated from the to-be-coupled portion 38. Thereafter, the table lifting mechanism 47 is actuated so that the lifting base 40 is lowered so as to be moved to its lower-limit position. Next, by the piston rod protruded by the actuation of the air cylinder 53, the component feed table 21 on the lifting base 40 is pushed onto the belt conveyor 48. At this point, the belt conveyor 48 is being driven to be circulated in the direction of an arrow D in FIG. 4 by the motor 200. By this operation, the component feed table 21 placed on the belt conveyor 48 is guided by the restricting guides 57 and the positioning guides 58 so as to be transferred forward of the apparatus body 1, and then shifted onto the turntable 49. Thereafter, the component feed table 21 is moved further forward by the piston rod of the air cylinder 54, and positioned to a specified position on the turntable 49. In this way, the component feed table 21 is once lowered and then moved forward, by which the component feed table 21 is allowed to pass below the board discharge means 3, or the board feed means 2 when the component exchanging device 44 is juxtaposed on the left side of the component feeding device 20, without any obstacles.

Next, as the turntable 49 is turned 180° by the drive of the rotation drive source 50, the component feed table 21 is reversed in the back-and-forth direction with the reels 13 located on the front side as shown in FIG. 1. As a result, the component feed table 21 comes to allow an easy exchange of itself or the component feed units or unit 12. Further, as the table lifting mechanism 51 is actuated so that the lifting base 40 is lifted, the component feed table 21 is lifted, as it is placed on the turntable 49, up to a specified exchange position as shown by two-dot chain lines in FIG. 4 and by solid lines in FIG. 1, and held as such. This exchange position is set to such a height as to be appropriate for the exchanging work of the component feed table 21 itself or the component feed units or unit 12. Accordingly, since the exchange of the component feed tables 21 is carried out at the position that is a particular position on the front side of the apparatus body 1 with an allowance for sufficient space and that is good at workability, the exchanging work can be accomplished easily and promptly while the safety of the worker can be ensured.

Upon completion of the exchange of the component feed tables 21, the component exchanging device 44 operates in the reverse order of the above-described component takeout process. More specifically, after the table lifting mechanism 51 is actuated so that the lifting base 40 is lowered to the lower-limit position, the turntable 49 turns 180° and the piston rod of the air cylinder 54 is protruded, by which the component feed table 21 on the turntable 49 is shifted onto the belt conveyor 48. Further, the component feed table 21 is transferred backward by the drive of circulation of the belt conveyor 48 in the direction of an arrow E as shown in FIG. 4, and shifted onto the lifting base 40 of the table lifting mechanism 47. Then, the component feed table 21 is pulled back by the piston rod of the air cylinder 53 so as to be positioned to a specified position on the lifting base 40.

Next, by the actuation of the table lifting mechanism 47, the lifting base 40 is lifted up to its upper-limit position. Thereafter, the coupling portion 59 of the piston rod of the air cylinder 52 is mated with the to-be-coupled portion 38. Subsequently, the air cylinder 52 is actuated so that the piston rod is protruded, by which the component feed table 21 is shifted from on the lifting base 40 of the table lifting mechanism 47 to on the lifting base 40 of the table lifting mechanism 27, thus being incorporated from the component exchanging device 44 into the circulation path of the component feeding device 20.

In this component mounting apparatus, the component feeding device 20 feeds the components to the mounting head section 8 while the component feeding device 20 is transferring the component feed tables 21 along the looped circulation path within the vertical plane. Therefore, although only three component feed tables 21 are shown in the circulation path as shown in FIG. 2, it is possible, actually, to arrange a multiplicity of component feed tables 21. Accordingly, even if an increased number of components to be mounted onto the circuit board P are involved, this required number of components can be divided and accommodated on a plurality of component feed tables 21, so that one component feed table 21 can be downsized. Moreover, the component feed tables 21 can be arranged vertically and three-dimensionally, so that the apparatus will not involve any increase in the installation space.

Also, since one component feed table 21 can be downsized, the component feed table 21 involves smaller drive force for its movement so that vibrations can be suppressed. Further, the exchanging work of the component feed tables 21 as well as the transferring operation of the component feed tables 21 in the circulation path can be carried out independently of and simultaneously with the component feeding operation to the mounting head section 8 by the component feed tables 21. Thus, a speedup of the component feeding process can be achieved.

Still, since the component feed tables 21 are transferred along the looped circulation path, the component exchanging device 44 is enabled to take out a component feed table 21 to be exchanged, from the specified point in the circulation path, and to transfer it to a specified point on the front side of the apparatus body 1 for an exchange. Accordingly, the exchanging work of the component feed tables 21 can be carried out extremely easily and promptly. Moreover, since the component feed tables 21 are exchanged by being departed from the circulation path of the component feeding device 20, the safety of the worker can be ensured. Furthermore, since the control of all the items including the state how components have been mounted onto the circuit board can be carried out on the front side of the apparatus body 1, the apparatus control is facilitated to a great extent, advantageously.

In the above embodiment, whereas the component feed table 21 can be transferred to a place on the forward, right side of the apparatus body 1 and exchanged for another as described above, the component feed table 21 otherwise may be exchanged by manual operation at a place on the forward, left side of the apparatus body 1, opposite to the foregoing. More specifically, it is also possible, as shown in FIGS. 1 and 3, to take out the component feed table 21 along guide rails 61 from the lifting base 40 of the left-side table lifting mechanism 22, and to place a new component feed table 21 conveyed by, for example, a wagon 60, along the guide rails 61 at a time. Reference numeral **60*a* in FIG. 1 is a space for holding the component feed table 21 on the wagon 60**.

Figure 6:
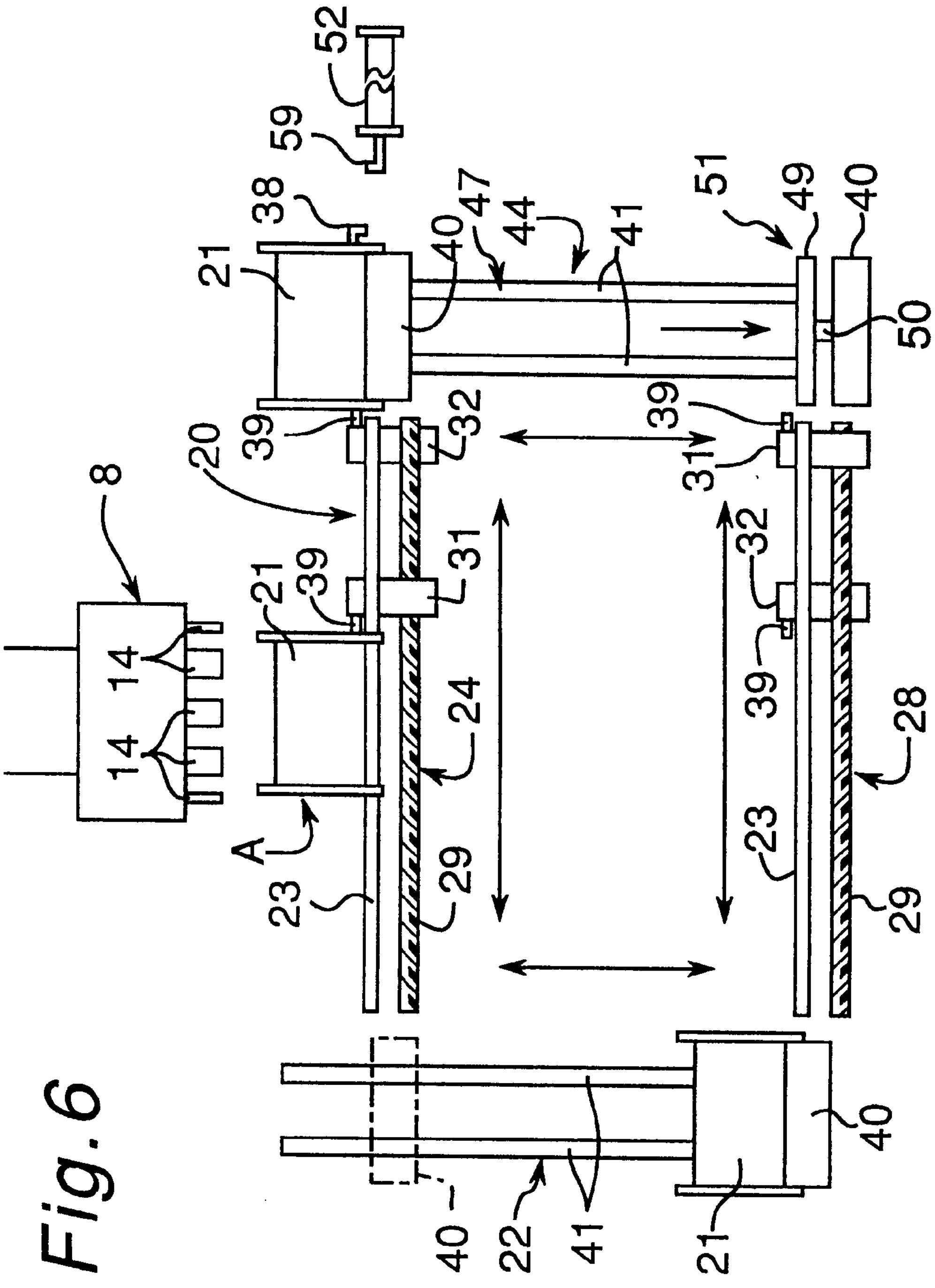
FIG. 6 is a schematic front view of the apparatus according to another embodiment of the present invention.
Figure 7:
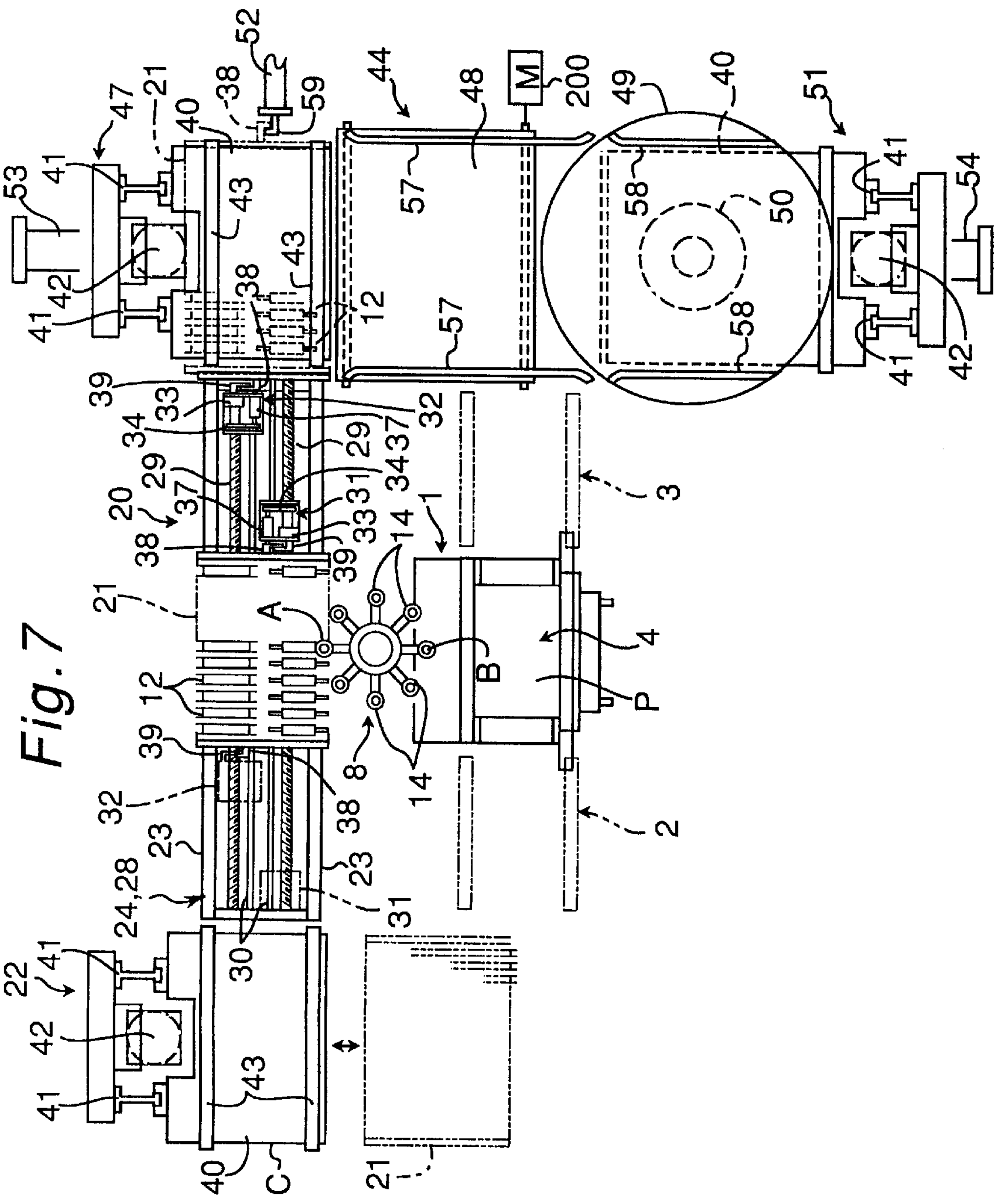
FIG. 7 is a schematic plan view of the apparatus of FIG. 6.

In the above embodiment, the component feed table 21 is moved from the upper-limit position of the table lifting mechanism 27 in the apparatus body 1, to the upper-limit position of the table lifting mechanism 47 in the component exchanging device 44. However, it is also possible to provide a component-table shifting means for moving the component feed table 21 from the lower-limit position of the table lifting mechanism 27 in the apparatus body 1, to the component exchanging device 44. Such an embodiment is shown in FIGS. 6 and 7. In this case, the lifting mechanism of the table lifting mechanism 47 in the component exchanging device 44 can be omitted so that the apparatus construction can be simplified.

As described above, according to the present invention, even if an increased number of components to be mounted onto a circuit board are involved, this required number of components can be divided and accommodated on a plurality of component feed tables, and these component feed tables are transferred along the table circulation path formed into a loop within a vertical plane. Therefore, the component feeding device will not be upsized so as to be protruded sideways, while the installation space of the apparatus will not increase. Further, the driving force for movement of the component feed tables can be lessened, and the exchange and transfer of the component feed tables can be carried out independently of and simultaneously with the component feeding operation to the mounting head section. Thus, a speedup of the component feeding process can be achieved. Still, since the component feed table can be transferred to the front side of the apparatus body and there exchanged for another, the exchanging work of the component feed tables can be carried out extremely easily and promptly while the safety of the worker can be ensured. Furthermore, the control of all the items including the state how components have been mounted onto the circuit board can be performed on the front side of the apparatus body very easily, advantageously.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus for use with components, said apparatus comprising:

an apparatus body including a front side, a rear side, and a board transfer member;

a mounting head section operable to mount components onto a board;

a plurality of component feed tables, each to accommodate components;

a component feeding device, disposed on said rear side of said apparatus body, operable to feed each of said component feed tables to a component feed position opposed to said mounting head section, wherein said component feeding device includes a component-feed-table circulation path within a vertical plane, and means for moving said component feed tables arranged within the circulation path along the circulation path;

a table exchange path which extends from a takeout position in the circulation path to an exchange position on said front side of the said apparatus body;

table transfer means for transferring at least one of said component feed tables horizontally between a lower rear-side transfer point, below an upper rear-side transfer position adjacent to the takeout position located in an upper part of the circulation path of said component feeding device, and a front-side transfer point located at said front side of said apparatus body, below said board transfer member of said apparatus body, so as to prevent said at least one component feed table from contacting said board transfer member; and a component exchanging device operable to transfer said at least one said component feed tables along the table exchange path between the takeout position and the exchange position, selectively in one of a direction in which the component feed table is directed from the takeout position to the exchange position and a direction in which the component feed table is directed from the exchange position to the takeout position.

2. The component mounting apparatus according to claim 1, wherein said component exchanging device comprises:

a rear-side table lifting mechanism disposed on said rear side of said apparatus body, operable to lift and lower at least one of said component feed tables between an upper rear-side transfer position adjacent to the takeout position located in an upper part of the circulation path of said component feeding device and a lower rear-side transfer position below the upper rear-side transfer position; and table transfer means for transferring said at least one of said component feed tables horizontally between the lower rear-side transfer point and a front-side transfer point located at said front side of said apparatus body, below said board transfer member of said apparatus body.

3. The component mounting apparatus according to claim 2, wherein said component exchanging device further comprises:

a front-side table lifting mechanism, disposed on said front side of said apparatus body, operable to lift and lower at least one of said component feed tables between the front-side transfer point and an exchange position located above the front-side transfer point.

4. The component mounting apparatus according to claim 3, further comprising:

a lifting base in said front-side table lifting mechanism; and a turntable; provided on said lifting base, operable to rotate at least one of said component feed tables placed on said turntable.

5. The component mounting apparatus according to claim 1, wherein said component exchanging device comprises:

component-feed-table shifting means for shifting at least one of said component feed tables to and from the takeout position located in a lower part of the circulation path of said component feeding device; and table transfer means for transferring at least one of said component feed tables horizontally between the component-feed-table shifting means and a front-side transfer point located at said front side of said apparatus body, below said board transfer member of said apparatus body.

6. The component mounting apparatus according to claim 5, wherein said component exchanging device comprises:

a front side table lifting mechanism disposed on said front side of said apparatus body, operable to lift and lower at least one of said component feed tables between the front-side transfer point and an exchange position located above the front-side transfer point.

7. The component mounting apparatus according to claim 6, further comprising:

a lifting base in said front-side table lifting mechanism; and a turntable, provided on said lifting base, operable to rotate at least one of said component feed tables placed on said turntable.

8. A component mounting apparatus for use with components, said apparatus comprising:

an apparatus body including a front side, a rear side, and a board transfer member;

a mounting head section operable to mount components onto a board;

a plurality of component feed tables, each to accommodate components;

a component feeding device, disposed on said rear side of said apparatus body, operable to feed each of said component feed tables to a component feed position opposed to said mounting head section, where said component feeding device includes a component-feed-table circulation path within a vertical plane, and a lifting and conveying system operable to move said component feed tables arranged within the circulation path along the circulation path;

a table exchange path which extends from a takeout position in the circulation path to an exchange position on said front side of the said apparatus body;

a table transfer cylinder and conveyor operable to transfer at least one of said component feed tables horizontally between a lower rear-side transfer point, below an upper rear-side transfer position adjacent to the takeout position located in an upper part of the circulation path of said component feeding device, and a front-side transfer point located at said front side of said apparatus body, below said board transfer member of said apparatus body, so as to prevent said at least one component feed table from contacting said board transfer member; and a component exchanging lifting and conveying system operable to transfer said at least one said component feed tables along the table exchange path between the takeout position and the exchange position, selectively in one of a direction in which the component feed table is directed from the takeout position to the exchange position and a direction in which the component feed table is directed from the exchange position to the takeout position.

9. The component mounting apparatus according to claim 8, wherein said component exchanging lifting and conveying system comprises:

a rear-side table lifting mechanism disposed on said rear side of said apparatus body, operable to lift and lower at least one of said component feed tables between an upper rear-side transfer position adjacent to the takeout position located in an upper part of the circulation path of said component feeding device and a lower rear-side transfer position below the upper rear-side transfer position; and a table transfer cylinder and conveyor operable to transfer said at least one of said component feed tables horizontally between the lower rear-side transfer point and a front-side transfer point located at said front side of said apparatus body, below said board transfer member of said apparatus body.

10. The component mounting apparatus according to claim 9, wherein said component exchanging device further comprises:

a front-side table lifting mechanism, disposed on said front side of said apparatus body, operable to lift and lower at least one of said component feed tables between the front-side transfer point and an exchange position located above the front-side transfer point.

11. The component mounting apparatus according to claim 10, further comprising:

a lifting base in said front-side table lifting mechanism; and a turntable; provided on said lifting base, operable to rotate at least one of said component feed tables placed on said turntable.

12. The component mounting apparatus according to claim 8, wherein said component exchanging device comprises:

component-feed-table shifting cylinder operable to shift at least one of said component feed tables to and from the takeout position located in a lower part of the circulation path of said component feeding device; and a table transfer cylinder and conveyer operable to transfer at least one of said component feed tables horizontally between the component-feed-table shifting cylinder and a front-side transfer point located at said front side of said apparatus body, below said board transfer member of said apparatus body.

13. The component mounting apparatus according to claim 12, wherein said component exchanging device comprises:

a front side table lifting mechanism disposed on said front side of said apparatus body, operable to lift and lower at least one of said component feed tables between the front-side transfer point and an exchange position located above the front-side transfer point.

14. The component mounting apparatus according to claim 13, further comprising:

a lifting base in said front-side table lifting mechanism; and a turntable, provided on said lifting base, operable to rotate at least one of said component feed tables placed on said turntable.

* * * * *